(12) United States Patent
Baumann et al.

(10) Patent No.: US 9,234,132 B2
(45) Date of Patent: Jan. 12, 2016

(54) CONVERSION LED WITH HIGH COLOR RENDITION INDEX

(75) Inventors: Frank Baumann, Regensburg (DE); Norbert Boenisch, München (DE); Tim Fiedler, München (DE); Frank Jermann, Königsbrunn (DE); Stefan Lange, Augsburg (DE); Reiner Windisch, Pettendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 44 days.

(21) Appl. No.: 13/391,197

(22) PCT Filed: Aug. 11, 2010

(86) PCT No.: PCT/EP2010/061694
§ 371 (c)(1),
(2), (4) Date: Feb. 17, 2012

(87) PCT Pub. No.: WO2011/020756
PCT Pub. Date: Feb. 24, 2011

(65) Prior Publication Data
US 2012/0146079 A1 Jun. 14, 2012

(30) Foreign Application Priority Data

Aug. 17, 2009 (DE) .......................... 10 2009 037 730

(51) Int. Cl.
*C09K 11/08* (2006.01)
*C09K 11/77* (2006.01)
(Continued)

(52) U.S. Cl.
CPC ........... *C09K 11/7774* (2013.01); *C04B 35/581* (2013.01); *C04B 35/584* (2013.01);
(Continued)

(58) Field of Classification Search
USPC ......... 313/503; 257/98; 252/301.4 R, 301.4 F
See application file for complete search history.

(56) References Cited

U.S. PATENT DOCUMENTS 7,888,691 B2 * 2/2011 Krames ........................... 257/89
8,178,001 B2 * 5/2012 Kaneda et al. .......... 252/301.4 F
(Continued)

FOREIGN PATENT DOCUMENTS

CN 101128563 2/2008
CN 101501161 8/2009
(Continued)

*Primary Examiner* — Carol M Koslow
(74) *Attorney, Agent, or Firm* — Cozen O'Connor

(57) ABSTRACT

A conversion LED comprising a chip which emits primary radiation and a luminescent substance-containing layer which is on the chip or positioned so that it intercepts the primary radiation emitted from the chip and which converts at least some of the primary radiation of the chip into secondary radiation, wherein a first luminescent substance of the $A_3B_5O_{12}$:Ce garnet type which emits yellow green and a second luminescent substance of the $MAlSiN_3$:Eu calsine type which emits orange red is used, wherein the peak wavelength of the primary radiation lies in the 435 to 455 nm range, the first luminescent substance being a garnet having essentially the cation A=75 to 100% Lu, remainder Y and a Ce content of 1.5 to 2.9%, where B=10 to 40% Ga, remainder Al, while the second luminescent substance is of the basic $MAlSiN_3$:Eu type where M is Ca alone or at least 80%, in particular at least 90%, preferably at least 95% Ca and the remainder of M may be Sr, Ba, Mg, Li or Cu, in each case alone or in combination, wherein some of the Al up to 20%, preferably at most 5%, can be replaced by B, and wherein N can be partially replaced by O, F, Cl, alone or in combination.

10 Claims, 14 Drawing Sheets

(51) Int. Cl.
  *C04B 35/581* (2006.01)
  *C04B 35/584* (2006.01)
  *H01L 33/50* (2010.01)

(52) U.S. Cl.
  CPC ......... *C09K11/0883* (2013.01); *C09K 11/7728* (2013.01); *C04B 2235/3224* (2013.01); *C04B 2235/3281* (2013.01); *C04B 2235/3852* (2013.01); *C04B 2235/444* (2013.01); *C04B 2235/445* (2013.01); *C04B 2235/446* (2013.01); *H01L 33/504* (2013.01); *H01L 2224/32245* (2013.01); *H01L 2224/48091* (2013.01); *H01L 2224/48247* (2013.01); *H01L 2224/73265* (2013.01)

(56) References Cited

U.S. PATENT DOCUMENTS

| | | |
|---|---|---|
| 2005/0189863 A1 | 9/2005 | Nagatomi et al. |
| 2006/0124947 A1 | 6/2006 | Mueller et al. |
| 2006/0226759 A1 | 10/2006 | Masuda et al. |
| 2006/0255712 A1 | 11/2006 | Masuda et al. |
| 2007/0007494 A1* | 1/2007 | Hirosaki et al. ........ 252/301.4 R |
| 2009/0008663 A1* | 1/2009 | Shimizu et al. ................ 257/98 |
| 2009/0283721 A1* | 11/2009 | Liu et al. ................ 252/301.4 H |

FOREIGN PATENT DOCUMENTS

| | | |
|---|---|---|
| EP | 1568753 | 8/2005 |
| EP | 1669429 | 6/2006 |
| EP | 1845146 | 10/2007 |
| JP | 2005-008844 | 1/2005 |
| JP | 2005-239985 | 9/2005 |
| TW | 200530374 | 9/2005 |
| TW | 200633270 | 9/2006 |
| WO | WO 2008/133077 | * 11/2008 |
| WO | WO 2009/069345 | 6/2009 |
| WO | WO 2009/083887 | 7/2009 |
| WO | WO 2011/020756 | 2/2011 |

* cited by examiner

CONVERSION LED WITH HIGH COLOR RENDITION INDEX

RELATED APPLICATIONS

This is a U.S. national stage of application No. PCT/EP2010/061694, filed Aug. 11, 2010.

This application claims the priority of German application no. 10 2009 037 730.1 filed Aug. 17, 2009, the entire content of which is hereby incorporated by reference.

FIELD OF THE INVENTION

The invention is related to a conversion LED comprising a chip which emits primary radiation and, positioned upstream of the chip, a luminescent substance-containing layer which converts at least some of the primary radiation of the chip into secondary radiation. Conversion LEDs of said type are suitable in particular for general lighting.

BACKGROUND OF THE INVENTION

A conversion LED which uses a calsine as the red luminescent substance is known from EP 1 696 016. A white LED is realized therewith using a blue LED and a yellow or green luminescent substance chosen from α sialon, $Y_2A_{15}O_{12}$:Ce or $(Y,Gd)_2(Al,Ga)_5O_{12}$:Ce.

EP-A 1 669 429 discloses a conversion LED which employs a blue chip together with special luminescent substance of the type $(Sr,Ba)_2Si_5N_8$:Eu in order to produce a white LED, wherein LuAG:Ce as well as similar luminescent substances which are co-doped with Ce and Pr are also used as additional luminescent substances to improve color rendering.

SUMMARY OF THE INVENTION

One object of the present invention is to provide a conversion LED which is equipped with a high color rendering index, wherein the conversion LED in particular achieves a long useful service life.

According to an embodiment of the invention a high-efficiency conversion LED is now provided. Not all luminescent substances are stable in LEDs that are operated at high currents, here in particular at least 250 mA, preferably at least 300 mA, known as high-power LEDs. This problem applies in particular to nitride or oxinitride luminescent substances such as the nitride silicate M2Si5N8:Eu. Many such luminescent substances, in particular nitrides of the M2Si5N8:D type with D as an activator, suffer significant conversion losses during operation in an LED. LEDs of this type lose up to 50% of their conversion efficiency over a short period of time (typically 1000 hours). This results in a marked instability of the chromaticity coordinate.

White LEDs are becoming increasingly important in general lighting applications. Demand is increasing in particular for warm white LEDs having low color temperatures, preferably in the 2900 to 3500 K range, in particular 2900 to 3100 K, and having a good color rendering index, in particular Ra is at least 93, preferably 96, and at the same time having high efficiency. Against the background of the imminent ban on less energy-efficient general-purpose incandescent lamps, alternative light sources having the best possible color rendering index (CRI) are steadily gaining in significance. Many consumers hold illuminating means having a light spectrum similar to that of incandescent lamps in high regard.

Popular commercially available warm white LEDs generally consist of a combination of a blue LED with yellow and red luminescent substances. The color rendering index is typically around 80 in most cases. As a rule, much better color rendering indices are achieved by adding further luminescent substances, though this has a negative impact on the processing, chromaticity coordinate stability and efficiencies. Furthermore, very long-wave blue LEDs (approx. 460 nm) are used in most cases to compensate for the blue-green gap in the spectrum. From the chip technology perspective it is, however, advantageous for reasons of efficiency to use LEDs having shorter chip wavelengths since these are significantly more efficient. Wavelengths (peaks) from 430 to 455 nm, in particular 435 to 445 nm are desirable.

The luminescent substances must fulfill a number of requirements: very high stability in respect of chemical influences, for example oxygen, humidity, interactions with encapsulation materials, as well as in respect of radiation. In order to ensure a stable chromaticity coordinate as the system temperature rises, there is additionally a need for luminescent substances having very low thermal quenching characteristics.

Prior art warm white LEDs having a very high CRI are usually realized through a combination consisting of a relatively long-wave LED comprising a blue-green, a green-yellow and a red luminescent substance. Both the use of long-wave LEDs and the use of three luminescent substances are unfavorable from the application viewpoint and from efficiency considerations.

A novel solution includes the combination of a novel green garnet luminescent substance and a narrowband red nitridoaluminosilicate luminescent substance. Compared with conventional yellow (YAG) or green-yellow (YAGaG) garnets, the new green garnet luminescent substance has a strongly green-shifted emission, while at the same time the excitation optimum is strongly shifted toward short wavelengths.

The spectral properties of the above-described luminescent substance combination permit the implementation of warm white LEDs up to solutions for 2900 to 3100 K having an extremely high CRI of 96 to 98 with at the same time very good red rendering (R9=90 to 99) in conjunction with blue LED chips having a peak wavelength of 440 to 445 nm. Even when very short-wave chips (peak wavelength 435 nm) are used, very good 95 CRI points are still reached. The restriction to just two converting luminescent substances greatly simplifies the processing in the LED and has a positive effect on the chromaticity coordinate stability. The two luminescent substances of the novel solution exhibit very high stability in LED aging tests. Furthermore, both luminescent substances are characterized by a very low thermal quenching response.

A simultaneous improvement is achieved in multiple crucial properties from the application perspective, namely in respect of aging stability, efficiency, usable chip wavelength range and temperature stability of the luminescent substances. This new solution differs from the known prior art warm white solutions in at least the following features:

Very strongly green-shifted garnet luminescent substance shifting "intelligently" with the LED wavelength. This affords advantages in terms of CRI, visual assessment, temperature stability;

short chip wavelength. This is a major advantage in terms of high efficiency;

long-wave, stable, but at the same time narrow-band red luminescent substance precision-tuned to the green luminescent substance. This affords advantages in terms of LED service life (efficiency, chromaticity coordinate stability), relatively high visual assessment with extremely good red rendering. It is desirable in this case for the full FWHM (Full Width at Half Maximum) of the narrowband red-emitting luminescent substance to be preferably less than 90 nm FWHM. It is desirable in this case for the full width at half maximum of the narrowband green-emitting luminescent substance to be preferably less than 115 nm FWHM.

Significant features of the invention in the form of a numbered list are:

1. A conversion LED having a chip which emits primary radiation and a luminescent substance-containing layer which is on the chip or positioned so that it intercepts the primary radiation emitted from the chip and which converts at least some of the primary radiation of the chip into secondary radiation, wherein a first luminescent substance of the $A_3B_5O_{12}$:Ce garnet type which emits yellow green and a second luminescent substance of the MAlSiN$_3$:Eu calsine type which emits orange red is used. The peak wavelength of the primary radiation lies in the 435 to 455 nm range, the first luminescent substance being a garnet having essentially the cation A=75 to 100% Lu, remainder Y and a Ce content of 1.5 to 2.9%, where B=10 to 40% Ga, remainder Al, while the second luminescent substance is of the basic MAlSiN$_3$:Eu type where M is Ca alone or at least 80%, in particular at least 90%, preferably at least 95% Ca and the remainder of M may be Sr, Ba, Mg, Li or Cu, in each case alone or in combination, wherein some of the Al up to 20%, preferably at most 5%, can be replaced by B, and wherein N can be partially replaced by O, F, Cl, alone or in combination.

2. The above-described conversion LED wherein in the case of the component B the first luminescent substance contains 10 to 40 mol.-% Ga, in particular 20 to 30%, the remainder being Al.

3. The above-described conversion LED wherein the first luminescent substance contains 1.5% to 2.9 mol.-% Ce, in particular 1.8 to 2.6 mol.-% Ce, as doping which is attributed to the component A, the remainder being A.

4. The above-described conversion LED wherein the second luminescent substance contains Ca alone as component M.

5. The above-described conversion LED wherein the second luminescent substance contains 0.2 to 1.3 mol.-% Eu, in particular 0.3 to 0.9%, as doping which is attributed to the component M 6. The above-described conversion LED wherein the second luminescent substance is CaAlSiN3:Eu with 0.3 to 0.8% Eu fraction of M.

7. The above-described conversion LED wherein the first luminescent substance is A3B5O12, where A=75 to 100% Lu, remainder Y and a Ce content of 1.5 to 2.5%, where B=10 to 40% Ga, remainder Al.

8. The above-described conversion LED wherein the first luminescent substance is A3B5O12, where A=80 to 100% Lu, remainder Y and a Ce content of 1.5 to 2.5%, where B=15 to 25% Ga, remainder Al.

BRIEF DESCRIPTION OF THE DRAWINGS

The invention shall be explained in more detail below with reference to a number of exemplary embodiments. In the figures.

DETAILED DESCRIPTION OF THE DRAWINGS

Figure 1:
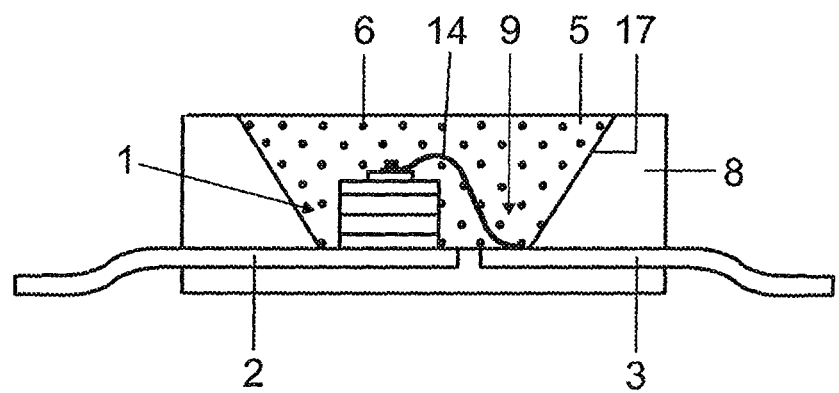
FIG. 1 shows a conversion LED.

FIG. 1 shows the structure of a conversion LED for RGB-based white light as known per se. The light source is a semiconductor component having an InGaN-type blue-emitting chip 1 with a peak emission wavelength of 435 to 455 nm peak wavelength, for example, 445 nm, which is embedded in a light-tight basic package 8 in the region of a recess 9. The chip 1 is connected via a bonding wire 14 to a first terminal 3 and directly to a second electrical terminal 2. The recess 9 is filled with a potting compound 5 containing as its principal constituents a silicon (60-90 weight %) and luminescent substance pigments 6 (less than 40 weight %). A first luminescent substance is a green-emitting garnet luminescent substance LuAGaG:Ce, another a red-emitting alumonitride silicate CaAlSiN$_3$:Eu. The recess has a wall 17 which serves as a reflector for the primary and secondary radiation from the chip 1 or, more specifically, the pigments 6.

Figure 2:
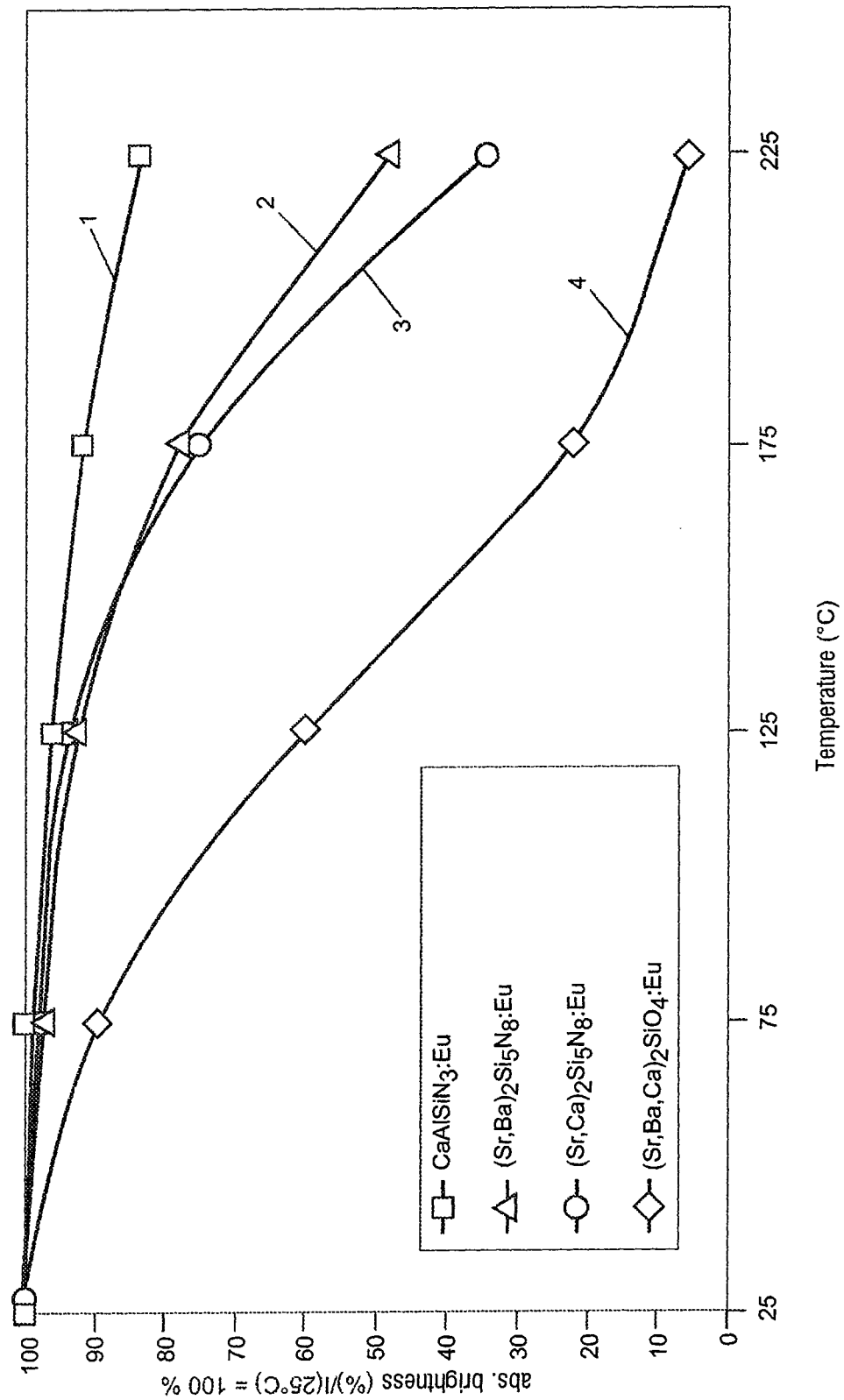
FIG. 2 shows a comparison of the temperature dependence of various red-emitting luminescent substances.

FIG. 2 shows the thermal quenching characteristics of various red-emitting luminescent substances which in principle can be readily excited by means of the chip from FIG. 1. The new deep-red luminescent substance CaAlSiN$_3$:Eu or (Ca$_{1-x}$Eu$_x$)AlSiN$_3$ is characterized by very low thermal quenching, with a fraction of 0.3% (x=0.003) to 0.8% Eu (x=0.008) being particularly well suited. An Eu fraction of M=Ca of x=0.002-0.012 is generally preferred, particularly preferably x=0.003-0.009. It is characterized by very low thermal quenching (see curve 1). The graph shows a comparison with other orange/red luminescent substances. Nitridosilicates containing Ba or Ca are much less suitable (see curves 2 and 3). Orthosilicates are not suitable (see curve 4). The luminescent substance CaAlSiN$_3$:Eu (CIE color coordinates where x/y=0.657/0.341) can usually be modified in multifarious ways for special requirements without significant changes in emission. In this case Ca can be replaced in small fractions up to 20%, in particular up to 10%, by Ba, Sr, Mg, Li or Cu alone or in combination. This applies similarly to the Al fraction, which can be replaced in small amounts, in particular up to 10%, by B.

An example of a modified luminescent substance $(Ca_{0.892}Mg_{0.1}Eu_{0.008})(Al_{0.99}B_{0.01})Si_1N_3$ (CIE x/y=0.657/0340) of the basic structure type "CaAlSiN$_3$:Eu" is given in Table 3. Further modifications with slightly altered cation ratio or partial CaSr substitution possibly in combination with a partial O/N substitution—such as e.g. $(Ca_{0.945}Sr_{0.045}Eu_{0.01})AlSi(N_{2.9}O_{0.1})$—are also possible.

Figure 3:
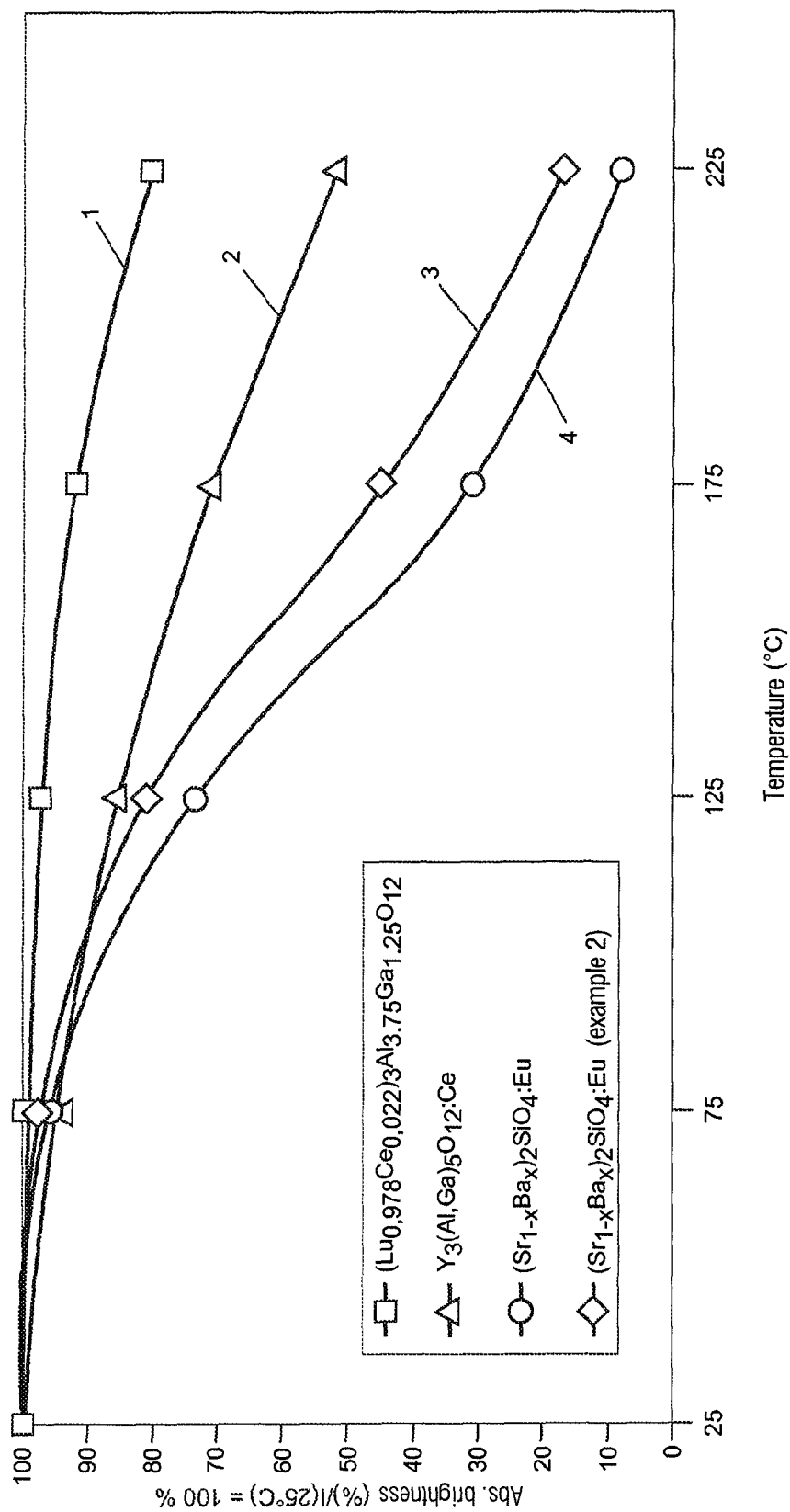
FIG. 3 shows a comparison of the temperature dependence of various green-emitting luminescent substances.

FIG. 3 shows the thermal quenching characteristics of various yellow-green-emitting luminescent substances which in principle can be readily excited by means of the chip from FIG. 1. The luminescent substance $A_3B_5O_{12}$:Ce in the embodiment variant with the preferred composition LuAGaG, i.e. $Lu_3(Al,Ga)_5O_{12}$:Ce with approx. 25% Ga fraction for component B (10-40% Ga is preferred, 15-30% Ga being particularly preferred) and approx. 2.2% Ce (1.5-2.9% Ce is preferred, 1.8-2.6% Ce being particularly preferred, in each case referred to the fraction A), is characterized by very low thermal quenching. A preferred luminescent substance is $Lu_{0.978}Ce_{0.022})_3Al_{3.75}Ga_{1.25}O_{12}$, (see curve 1). The graph shows a comparison with other yellow and green luminescent substances which exhibit considerably poorer thermal quenching behavior. Orthosilicates (see curves 3,4) are totally unsuitable, but YAGaG, i.e. $Y_3(Al,Ga)_5O_{12}$:Ce according to curve 2, is also considerably poorer.

Figure 4:
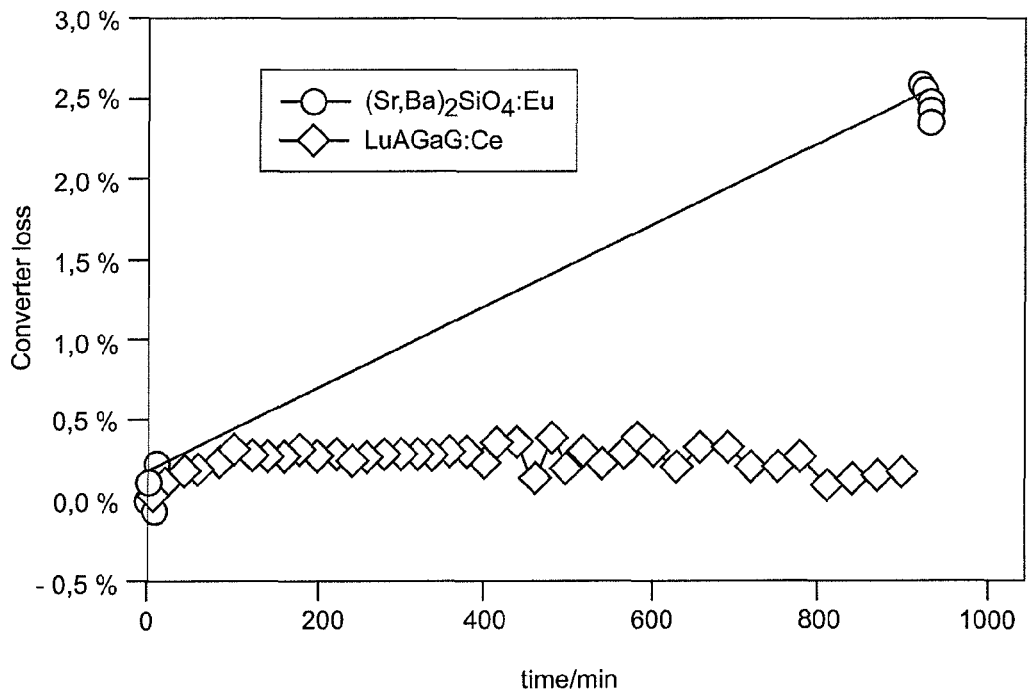
FIG. 4 shows a comparison of the time dependence of the converter losses for various luminescent substances.

FIG. 4 shows the stability of the yellow-green component. The stability of the green luminescent substance with the preferred composition LuAGaG with approx. 25% Ga and approx. 2.2% Ce, $(Lu_{0.978}Ce_{0.022})_3Al_{3.75}Ga_{1.25}O_{12})$ was determined in an LED aging test and compared with other known yellow/green-emitting luminescent substances. In the test a high-power blue LED ($\lambda_{peak}$=435 nm) was encapsulated in silicon with a dispersion of the respective luminescent substance and driven at 350 mA for 1000 h. The relative intensities of the blue LED peak and of the luminescent substance peak were measured at the start and at the end of the test and the loss of conversion efficiency determined therefrom. This LuAGaG luminescent substance is perfectly stable (square measurement points) within the bounds of the measurement errors, whereas under comparable conditions an orthosilicate will exhibit clear signs of aging (round measurement points).

The color rendering index of the warm white LED having the novel luminescent substance mixture according to the invention (LuAGaG plus deep-red CaAlSiN$_3$) shows a small dependence on the exciting blue LED wavelength used. A shift in the peak wavelength by 9 nm produces a CRI loss (Ra8) of only 3 points in the color rendering index. Other typical mixtures lose 5 points already with a difference of 7 nm peak wavelength in the blue (see Table 1). In order then to reduce the CRI loss there to 1 point it is necessary to add a third luminescent substance, which has a negative impact on efficiency and color steering. The dependence of the color rendering index on saturated red in particular is also very severely reduced, as is made apparent by the discrete value for R9.

Tab. 1 shows for the last two samples that excellent CRI values, namely Ra8 is at least 94 and the red index R9, at least 90, are possible in the 435 nm to 445 nm peak wavelength range of the exciting LED at a color temperature von 3000 to 3100 K.

TABLE 1

| Peak wavelength of the blue LED/nm | Color temperature/ K | Luminescent substance 1 (green-yellow) | Luminescent substance 2 (orange-red) | Luminescent substance 3 (blue-green) | Ratio yellow:red | CRI Ra8 | R9 |
|---|---|---|---|---|---|---|---|
| 462 | 3200 | YAG: 3% Ce | (Sr, Ca)$_2$Si$_5$N$_8$: Eu (60% Sr) | — | 9:1 | 81 | 23 |
| 455 | 3250 | YAG: 3% Ce | (Sr, Ca)$_2$Si$_5$N$_8$: Eu (60% Sr) | — | 10.3:1 | 76 | 8 |
| 455 | 3200 | YAG: 3% Ce | (Sr, Ca)$_2$Si$_5$N$_8$: Eu (60% Sr) | green chloro-silicate | 9:1 | 80 | 25 |
| 462 | 3250 | YAGaG: 4% Ce (25% Ga) | (Sr, Ca)$_2$Si$_5$N$_8$: Eu (60% Sr) | — | 6.1:1 | 86 | 43 |
| 455 | 3250 | YAGaG: 4% Ce (25% Ga) | (Sr, Ca)$_2$Si$_5$N$_8$: Eu (60% Sr) | — | 7:1 | 83 | 34 |
| 444 | 3200 | YAGaG: 4% Ce (25% Ga) | (Sr, Ca)$_2$Si$_5$N$_8$: Eu (60% Sr) | — | 7:1 | 77 | 20 |
| 444 | 3050 | LuAGaG: 2.2% Ce (25% Ga) | CaAlSiN$_3$: Eu | — | 3.35:1 | 97 | 96 |
| 435 | 3025 | LuAGaG: 2.2% Ce (25% Ga) | CaAlSiN$_3$: Eu | | 2:1 | 94 | 96 |

Figure 5:
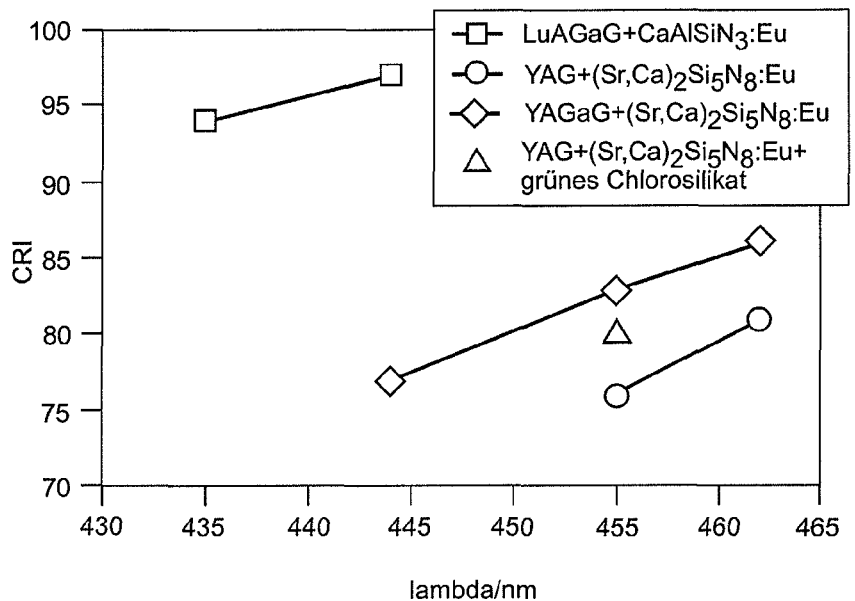
FIG. 5 shows a comparison of the CRI for various luminescent substance mixtures with primary excitation wavelength shifting.
Figure 6:
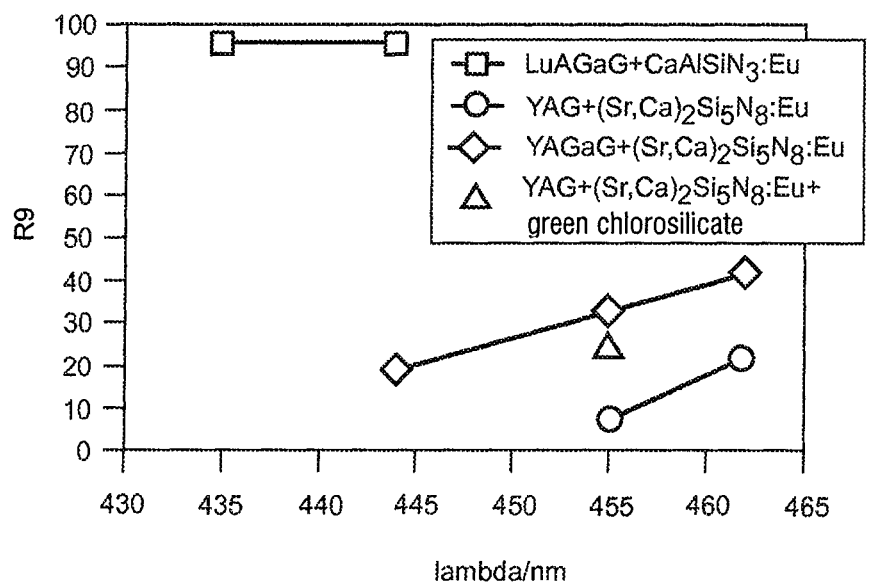
FIG. 6 shows a comparison of the R9 for various luminescent substance mixtures with primary excitation wavelength shifting.

FIGS. 5 and 6 show the color rendering index (CRI) Ra8 and the red index R9 for various systems. The color rendering index of the warm white LED having the novel luminescent substance mixture according to the invention (LuAGaG+ deep-red CaAlSiN$_3$) shows only a slight dependence on the LED wavelength used. A shift in the blue wavelength by 9 nm produces a CRI loss of 3 points only. Other typical mixes lose 5 points already with a difference of 7 nm in blue wavelength (see Table 1). In order to reduce the CRI loss to 1 point it is necessary to add a third luminescent substance, which has a negative impact on efficiency and color steering.

In particular the dependence of the color rendering index on saturated red is also very greatly reduced, as is made apparent by the discrete value for R9 (see FIG. 6).

Figure 7:
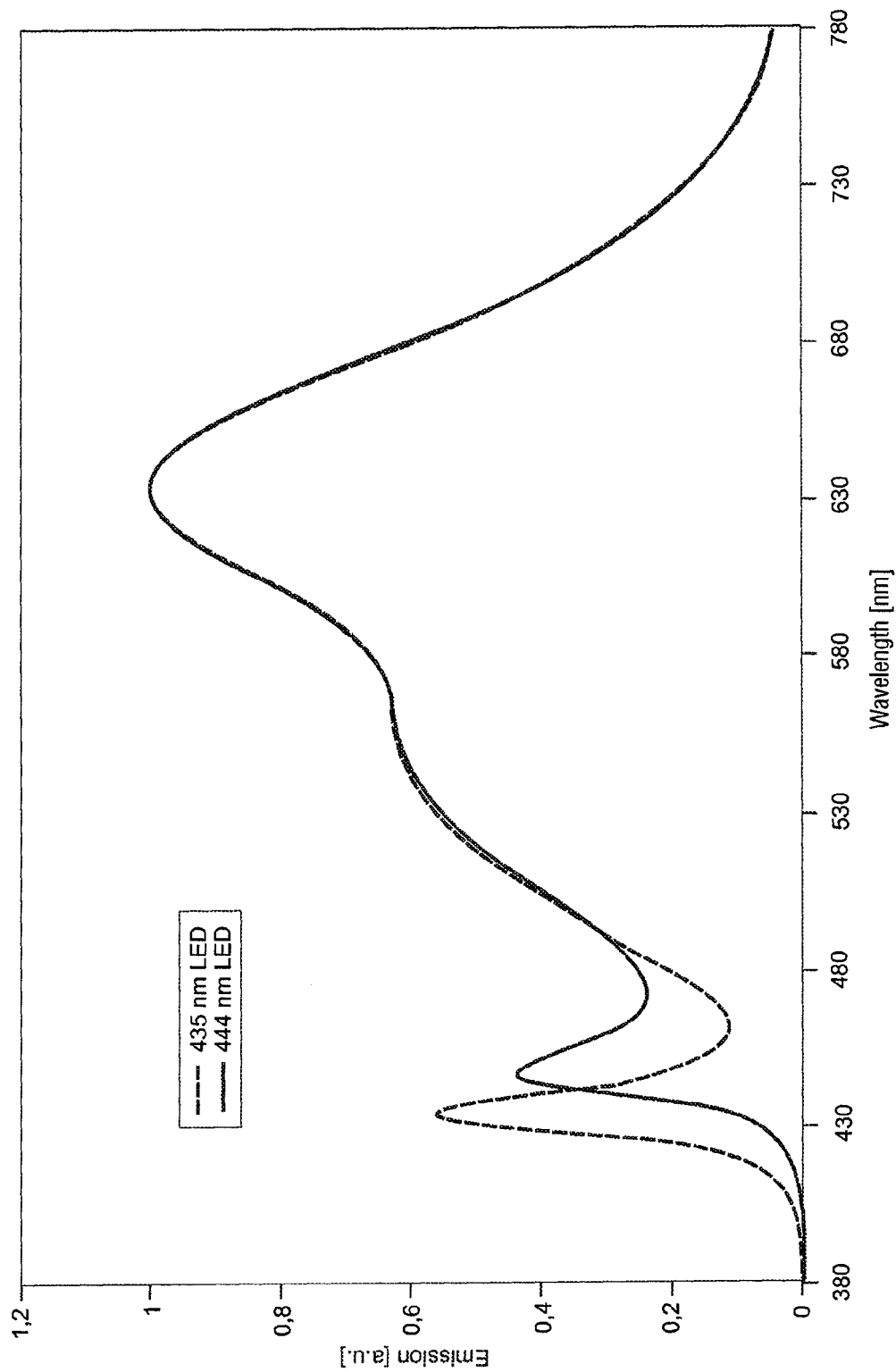
FIG. 7 shows a comparison of the overall emission of a conversion LED with various primary emissions.

FIG. 7 explains the cause for the low dependence of the color rendering index CRI on the blue wavelength: In the system according to the invention the luminescent substance emission shifts surprisingly with increasingly shortwave excitation wavelength clearly toward short wavelengths (see the region at about 530 nm. This results in a certain compensation in the overall spectrum: The blue-green fractions that are missing when an LED emitting at shorter wavelengths is used are virtually balanced out by the stronger blue-green fractions of the shifted luminescent substance emission.

Figure 8:
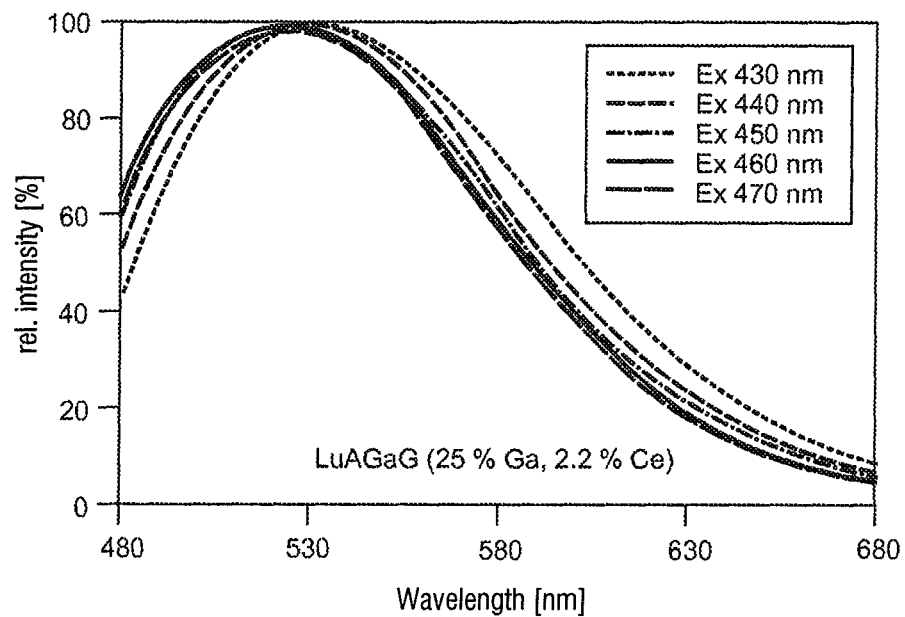
FIGS. 8-10 show a comparison of the emission of LuAGaG and YAGaG and mixed sion with different peak position of the primary emission (Ex)
Figure 9:
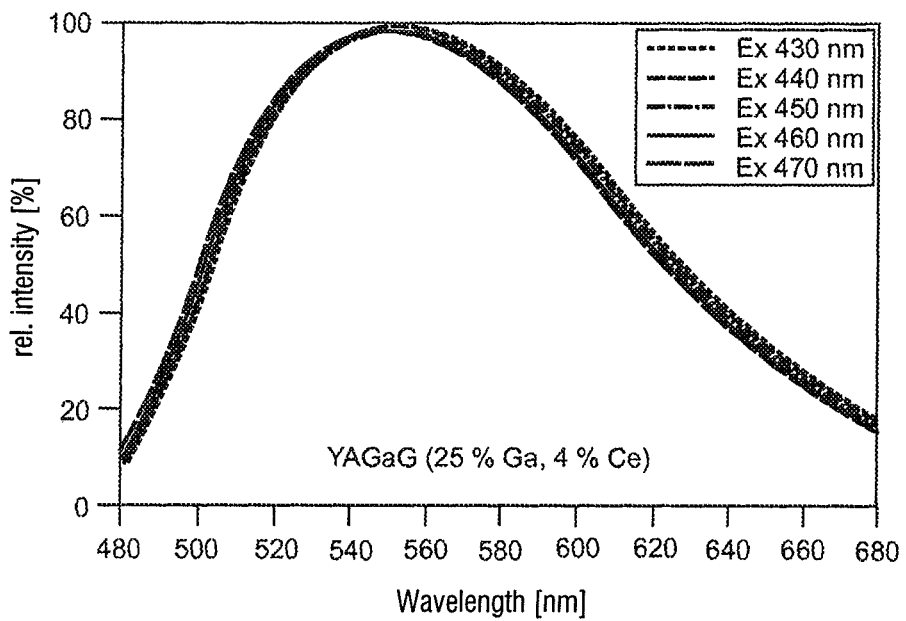
Figure 10:
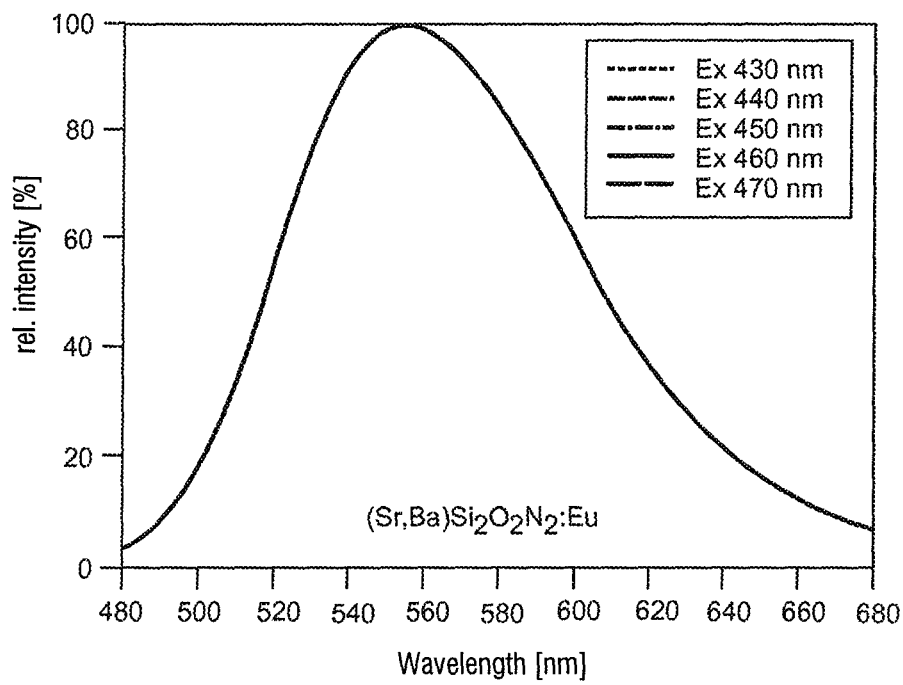

FIG. 8 shows the relative intensity in the case of a shift of the luminescent substance spectrum of the green-yellow luminescent substance with variable excitation wavelength between 430 and 470 nm (Ex430 to 470) compared with YAGaG:Ce (FIG. 9) and yellow (Sr,Ba)Si$_2$O$_2$N$_2$:Eu (FIG. 10).

Surprisingly, the novel green LuAGaG garnet behaves in a significantly different manner to the comparative luminescent substances. It exhibits a strong green shift with declining excitation wavelength. The comparative luminescent substances remain roughly constant. The emission spectra of the three luminescent substances are shown in comparison in the range of excitation by means of a LED with peak wavelength between 430 and 470 nm that is relevant to LED applications. The curves in FIG. 10 all overlay one another so closely that practically only one curve can be seen.

Figure 11:
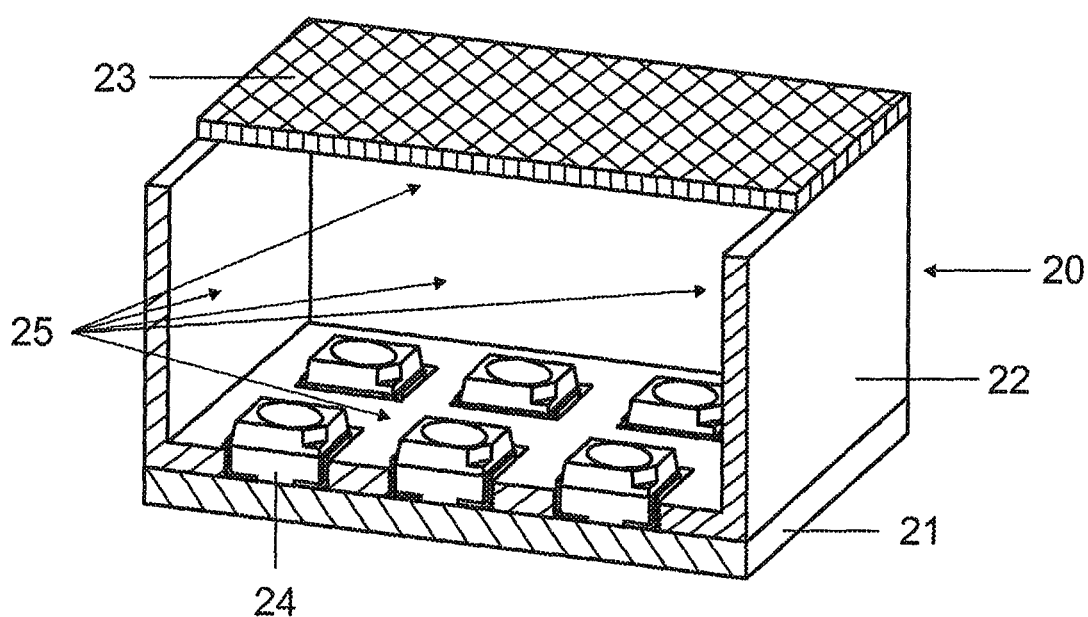
FIG. 11 shows an LED module with remotely attached luminescent substance mixture.

The use of a lutetium garnet has a significantly positive impact overall on the color rendering index. Compared with yttrium garnets with similar luminescent substance emission wavelength, much higher color rendering index values Ra8 and R9 are obtained with LuAGaG (see Table 2). As a result of this and by virtue of the good excitability at short wavelengths it is possible for the first time to use high-efficiency shortwave blue LEDs for warm white conversion LEDs for a color temperature of 2900 to 3150 K.

or else, as known per se, on a separate carrier positioned upstream of the LED. FIG. 11 shows such a module 20 with various LEDs 24 on a baseplate 21. Over it is mounted a package with side walls 22 and a cover plate 12. The luminescent substance mixture is applied here as a layer 25 both on the side walls and above all on the cover plate 23, which is transparent.

In principle it is not precluded that the garnet according to the invention, in addition to having predominantly Lu as principal component, also includes fractions of Y as cation A. These should be in the range of up to 32% at maximum. Other cations such as Tb, La, etc. are not categorically ruled out as additives, but due to their lack of conformance with the system (Lu, Y) should only be used in small amounts, preferably max. 5% of A, for any special-purpose adaptations of the properties of the luminescent substance.

TABLE 2

| Peak wavelength of the blue LED/nm | Color temperature/ K | Luminescent substance 1 (green-yellow) | Luminescent substance 2 (orange-red) | Ratio yellow:red | Ra8 | R9 (deep red) |
|---|---|---|---|---|---|---|
| 444 | 3050 | YAGaG: 40% Ga, 2% Ce | CaAlSiN$_3$: Eu | 2.3:1 | 95 | 82 |
| 444 | 3000 | LuAGaG: 2.2% Ce, 25% Ga | CaAlSiN$_3$: Eu | 2.55:1 | 98 | 96 |
| 444 | 3050 | LuAGaG: 2.2% Ce, 25% Ga | CaAlSiN$_3$: Eu | 3.6:1 | 98 | 99 |

A very high color rendering index is achieved with just two luminescent substances, despite shortwave blue LED in the 435 to 455 nm range. In this case the special tuning of the two chosen luminescent substances to each other is important. For example, the use of a red luminescent substance of the nitridosilicate type emitting at an even longer wavelength does not increase the CRI value or the value for the red rendering R9, but yields poorer values. The use of Y garnets does not lead to the sort of high values that can be realized with Lu garnet. Details of various mixtures can be found in Tab. 3. Gd is totally unsuitable as a principal component and should, like Tb or La, be added to the component A at best in small amounts up to 5 mol.-% for fine tuning. In contrast, a Y fraction of up to approx. 30%, preferably with a fraction of 10 to 25%, makes a good addition to Lu. The cause is the relatively similar ionic radius of Lu and Y. However, higher values of Y would shift the emission of the luminescent substance back into a range which would adversely affect the desired performance of the overall system.

Suitable modified calsines are shown in Tab. 4. This relates to systems that originate from the basic system CaAlSiN3:Eu. In this case the elements O, F, Cl can replace a percentage of the N, while the element Cu can replace a percentage of Ca.

Figure 12:
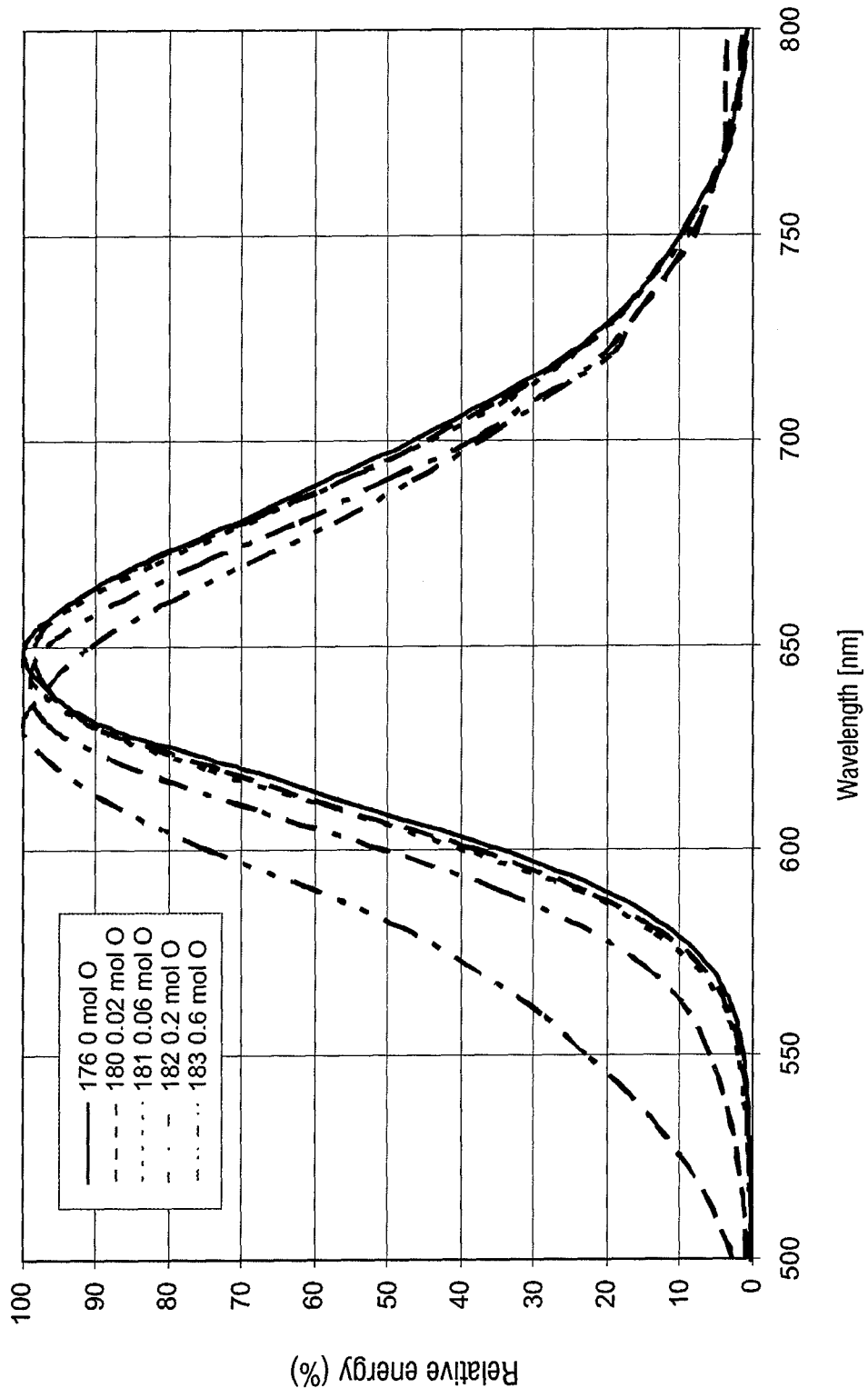
FIG. 12 shows a comparison of the emission in the case of calsines containing O.

FIG. 12 shows emission spectra for various calsines in which N is partially replaced by small amounts of O (see Tab. 4). In order not to widen the full width at half maximum too severely, the O fraction should preferably not exceed 0.2 mol.-%.

Figure 13:
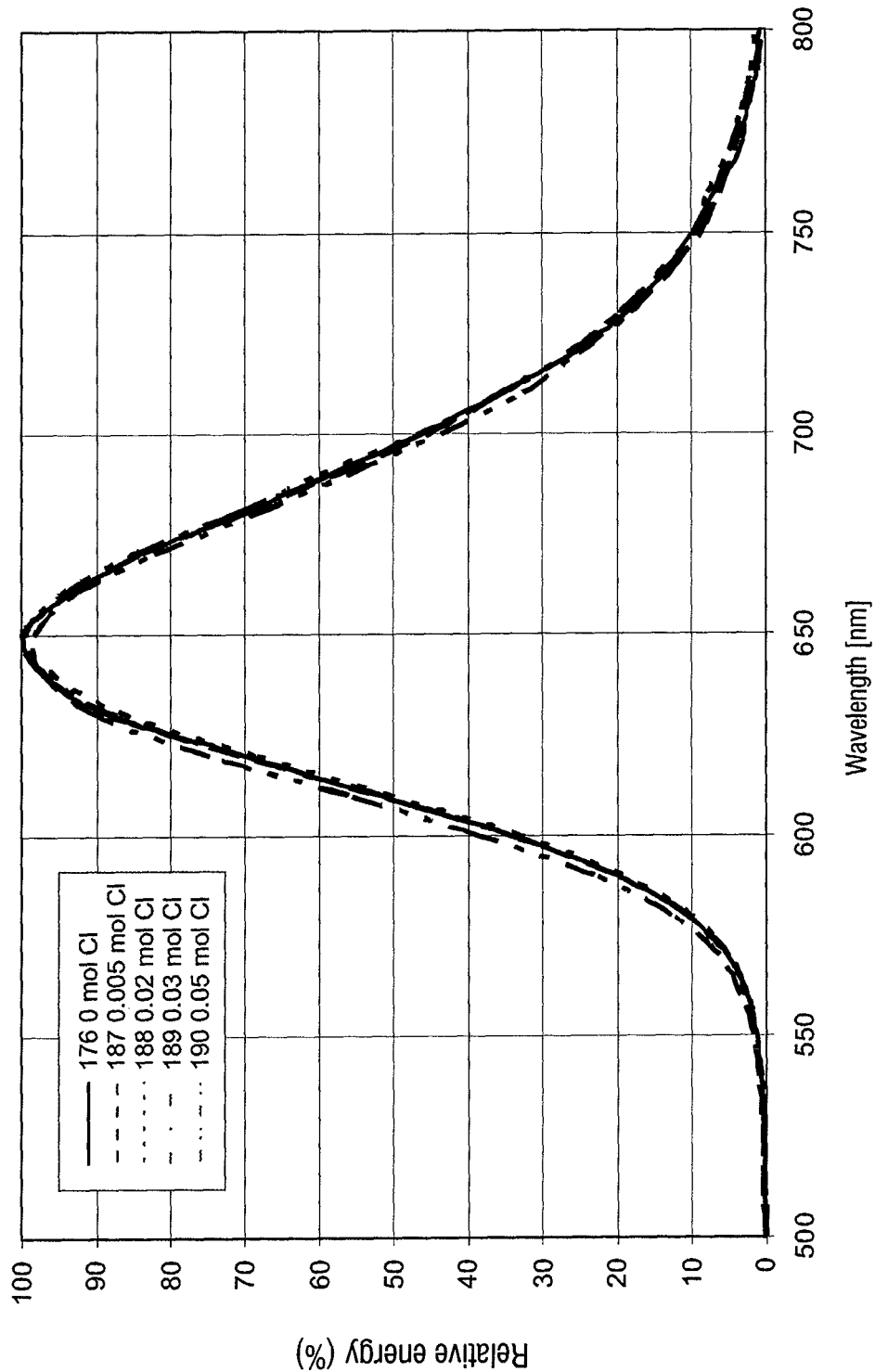
FIG. 13 shows a comparison of the emission in the case of calsines containing Cl.

FIG. 13 shows emission spectra for various calsines in which N is partially replaced by small amounts of Cl (see Tab. 4). In order not to widen the full width at half maximum too severely, the Cl fraction should preferably not exceed 0.05 mol.-%.

Figure 14:
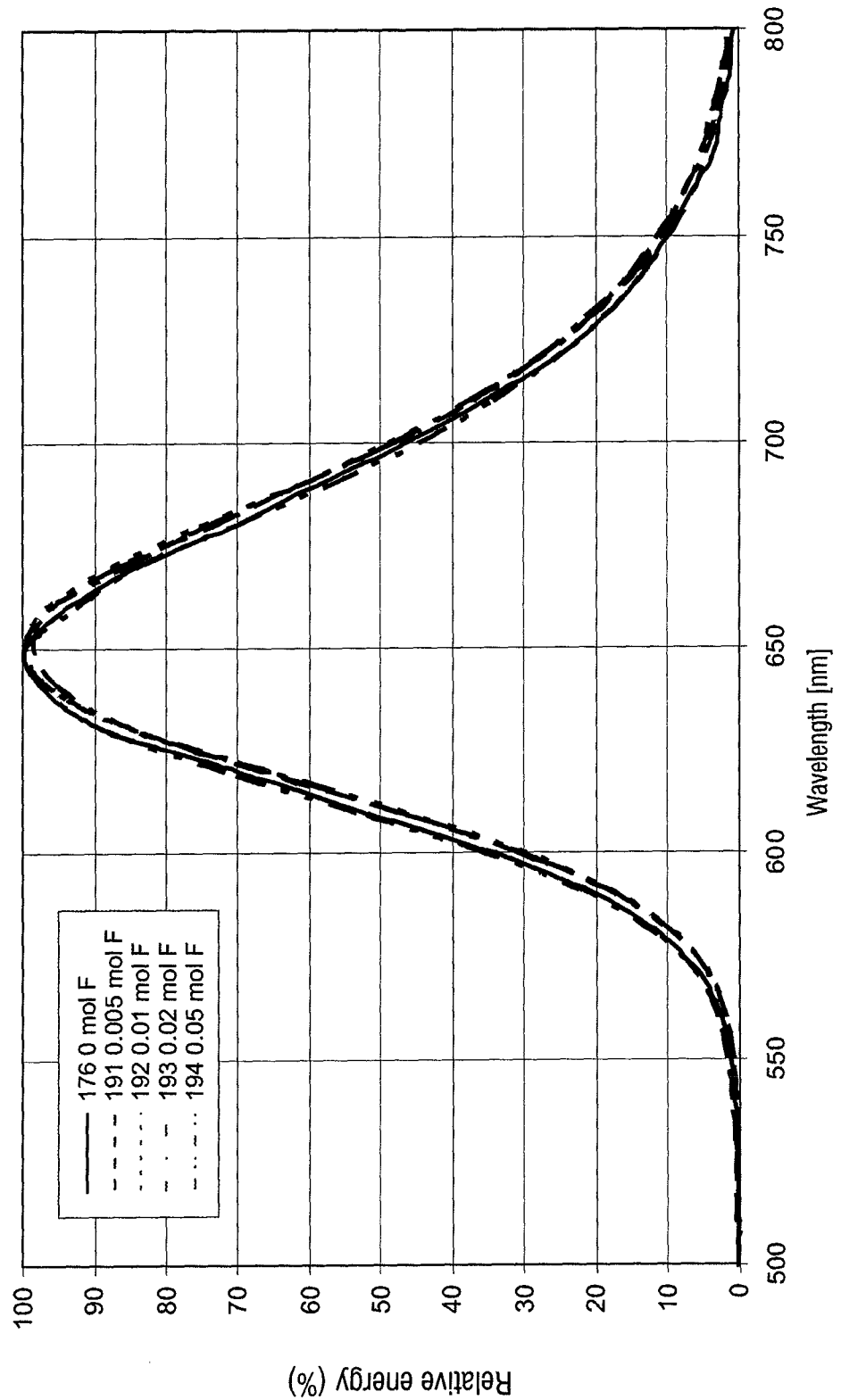
FIG. 14 shows a comparison of the emission in the case of calsines containing F.

FIG. 14 shows emission spectra for various calsines in which N is partially replaced by small amounts of F (see Tab. 4). In order not to widen the full width at half maximum too severely, the F fraction should preferably not exceed 0.05 mol.-%.

TABLE 3

Comparison of various luminescent substance mixtures at approx. 3000 K (preferred solutions in bold); Peak stands for peak wavelength of the blue LED (nm); R9 denotes saturated red.

| Peak nm | Color temperature/ K | Luminescent substance 1 (green-yellow) | Luminescent substance 2 (red) | Ratio yellow:red | Ra8 | R9 |
|---|---|---|---|---|---|---|
| 444 | 3050 | YAGaG: 40% Ga, 2% Ce | Ca$_{0.94}$Eu$_{0.02}$Li$_{0.045}$A$_{l3.8}$Si$_{8.2}$N$_{18}$ | 2.2:1 | 89 | 66 |
| 444 | 3000 | YAGaG: 40% Ga, 2% Ce | Sr$_{1.14}$Ca$_{0.74}$Eu$_{0.12}$Si$_5$N$_8$ | 9.4:1 | 89 | 62 |
| 444 | 3000 | YAGaG: 40% Ga, 2% Ce | Ca$_{0.992}$Eu$_{0.008}$AlSiN$_3$ | 3:1 | 94 | 83 |
| 444 | 3050 | YAGaG: 40% Ga, 2% Ce | Sr$_{0.76}$Ba$_{0.96}$Ca$_{0.16}$Eu$_{0.12}$Si$_5$N$_8$N$_8$ | 9:1 | 84 | 32 |
| 444 | 3050 | YAGaG: 40% Ga, 2% Ce | Ca$_{0.992}$Eu$_{0.008}$AlSiN$_3$ | 2.3:1 | 95 | 82 |
| 444 | 3000 | LuGaG: 2.5%% Ce, 25% Ga | Ca$_{0.992}$Eu$_{0.008}$AlSiN$_3$ | 2.55:1 | 98 | 96 |
| 444 | 3050 | LuGaG: 2.2% Ce, 25% Ga | Ca$_{0.992}$Eu$_{0.008}$AlSiN$_3$ | 3.6:1 | 98 | 99 |
| 435 | 3025 | LuGaG: 2.2% Ce, 25% Ga | Ca$_{0.992}$Eu$_{0.008}$AlSiN$_3$ | 2:1 | 94 | 96 |
| 444 | 3000 | LuGaG: 2.2% Ce, 25% Ga | Ca$_{0.892}$Mg$_{0.1}$Eu$_{0.008}$Al$_{0.99}$B$_{0.01}$Si$_1$N$_3$ | 2:1 | 97 | 94 |

Figure 15:
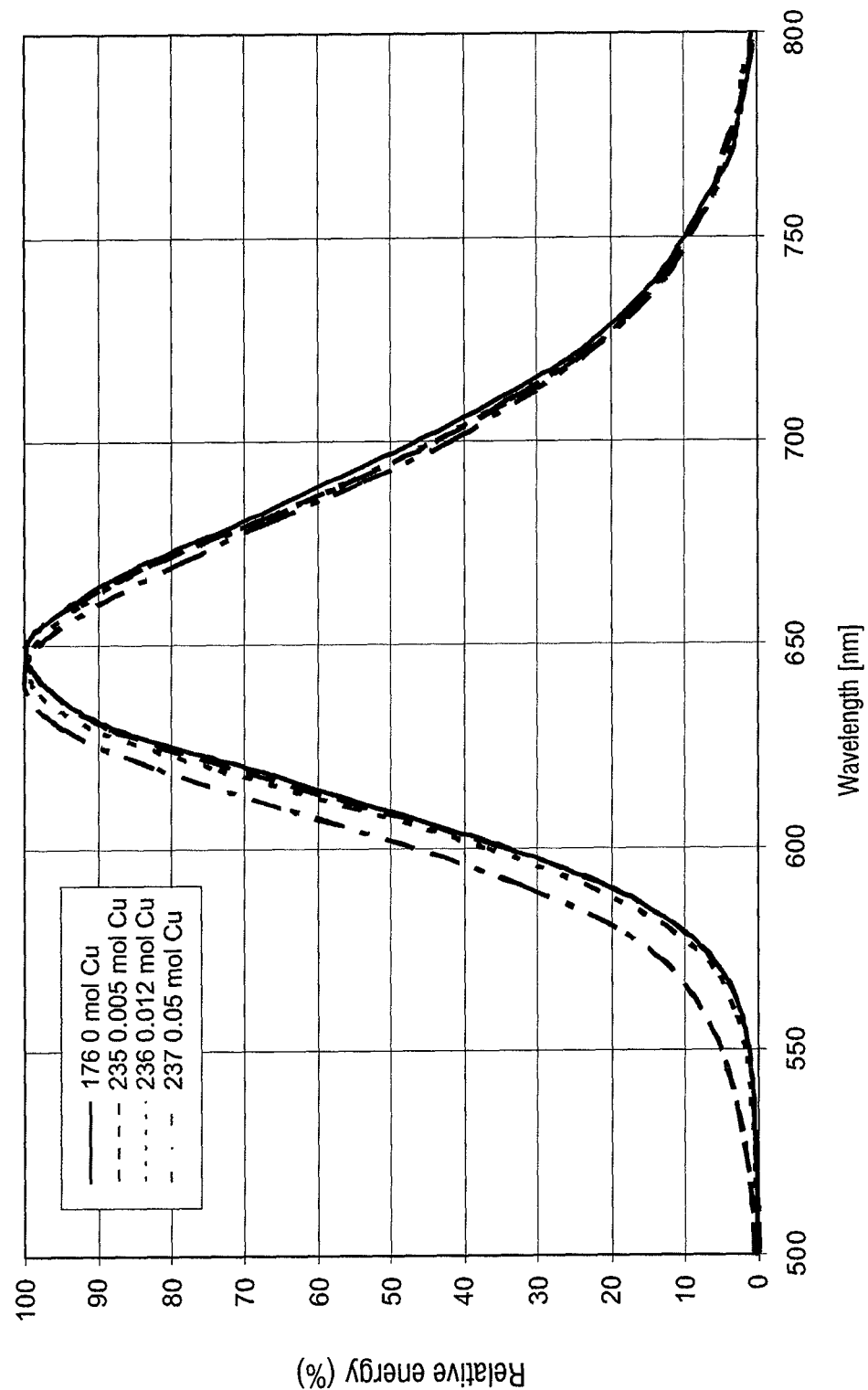
FIG. 15 shows a comparison of the emission in the case of calsines containing Cu.

In principle it is possible to use the luminescent substance mixture as a dispersion, as a thin film, etc. directly on the LED FIG. 15 shows emission spectra for various calsines in which Ca is partially replaced by small amounts of Cu (see Tab. 4). This allows a shift toward shorter wavelengths to be achieved. In order to prevent efficiency losses becoming too great due to lattice distortions, the Cu fraction should preferably not exceed 0.05 mol.-%. The production process is successful here in the following way:

TABLE 5

Production of Cu-containing calsines (sample 236)

| S236 Substance | Element | Atomic ratio | Initial weight |
|---|---|---|---|
| $Ca_3N_2$ | Ca | 0.983 | 10.537 g |
| $CuF_2$ | Cu | 0.012 | 0.238 g |
| $Si_3N_4$ | Si | 1.000 | 10.143 g |
| AlN | Al | 1.000 | 8.891 g |
| $Eu_2O_3$ | Eu | 0.005 | 0.191 g |
| Total sample weight | | | 30.000 g |

All the starting materials are weighed out inside the glovebox and homogenized for six hours in a planetary mill. The mixture is loosely filled into a tightly closing crucible made of molybdenum and transferred to a high-temperature tubular furnace.

The annealing is carried out under a flowing nitrogen atmosphere (2 l/min). The sample is heated at a rate of 250 K/h to 1600° C., held at that temperature for four hours and cooled down to room temperature likewise at 250 K/h.

The resulting annealed cake is milled in a mortar mill and screened through a 30 μm gauze. The screened material is filled back into the crucible and annealed once more in a similar manner to the first annealing.

The resulting annealed cake is milled in a mortar mill and screened through a 30 μm gauze. The screened material is the luminescent substance S236.

The production of calsine as sample S176 is shown in Tab. 6.

TABLE 6

Production of calsine (sample 176)

| S176 Substance | Element | Atomic ratio | Initial weight |
|---|---|---|---|
| $Ca_3N_2$ | Ca | 1.000 | 17.899 g |
| $Si_3N_4$ | Si | 1.000 | 16.937 g |

TABLE 6-continued

Production of calsine (sample 176)

| S176 Substance | Element | Atomic ratio | Initial weight |
|---|---|---|---|
| AlN | Al | 1.000 | 14.846 g |
| $Eu_2O_3$ | Eu | 0.005 | 0.319 g |
| Total sample weight | | | 50.000 g |

All the starting materials are weighed out inside the glovebox and homogenized in a planetary mil for six hours 1. The mixture is loosely filled into a tightly closing crucible made of molybdenum and transferred to a high-temperature tubular furnace.

The annealing is carried out under a flowing nitrogen atmosphere. The sample is heated at a rate of 250 K/h to 1600° C., held at that temperature for four hours and cooled down to room temperature likewise at 250 K/h.

The resulting annealed cake is milled in a mortar mill and screened through a 30 μm gauze. The screened material is filled back into the crucible and annealed once more in a similar manner to the first annealing.

The resulting annealed cake is milled in a mortar mill and screened through a 30 μm gauze. The screened material is the luminescent substance S176.

Figure 16:
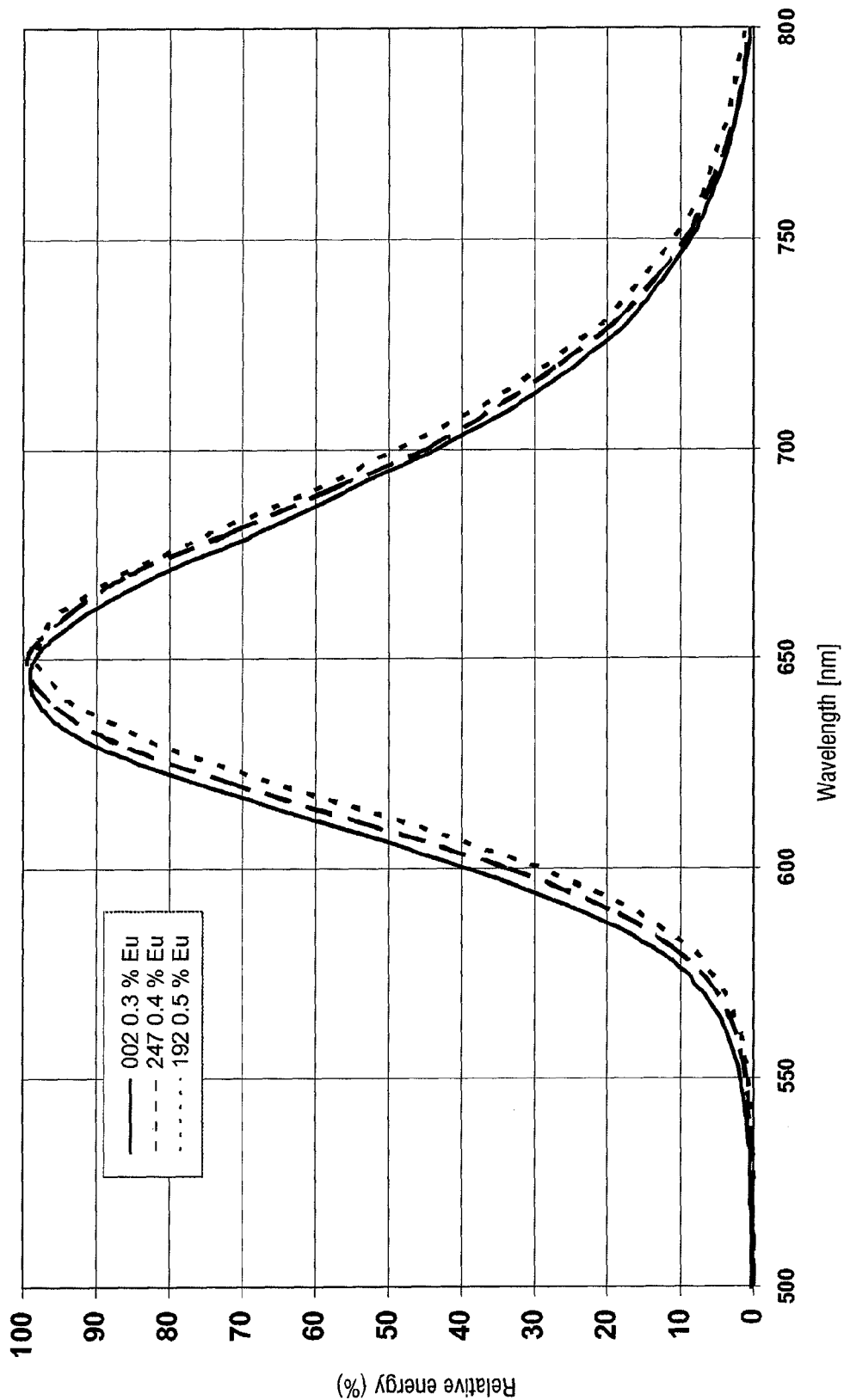
FIG. 16 shows a comparison of the emission in the case of calsines containing different proportions of Eu.

FIG. 16 shows emission spectra for various calsines in which the percentage of the activator Eu has been varied. It is apparent that the emission shifts toward shorter wavelengths, the smaller the chosen concentration of activator. In this case it lies between 0.3 and 0.5 mol.-%.

Tab. 7 shows various garnets from the $A_3B_5O_{12}$:Ce system, where A is chosen from (Lu, Y). It is demonstrated here that good values can be achieved for A=Lu up to A=70% Lu, remainder Y. At the same time the ratio between Al and Ga must be chosen carefully for component B. The Ga fraction should be between 10 and 40 mol.-%, in particular 10 to 25%. Various $A_3B_5O_{12}$:Ce (Lu,Y) garnets are shown in Tab. 7, the concentration of the activator Ce being 2% of A in each case and the chosen ratio is A=Lu,Y (the Lu fraction is specified, remainder is Y) and B=Al,Ga (the Ga fraction is specified, remainder is Al).

Figure 17:
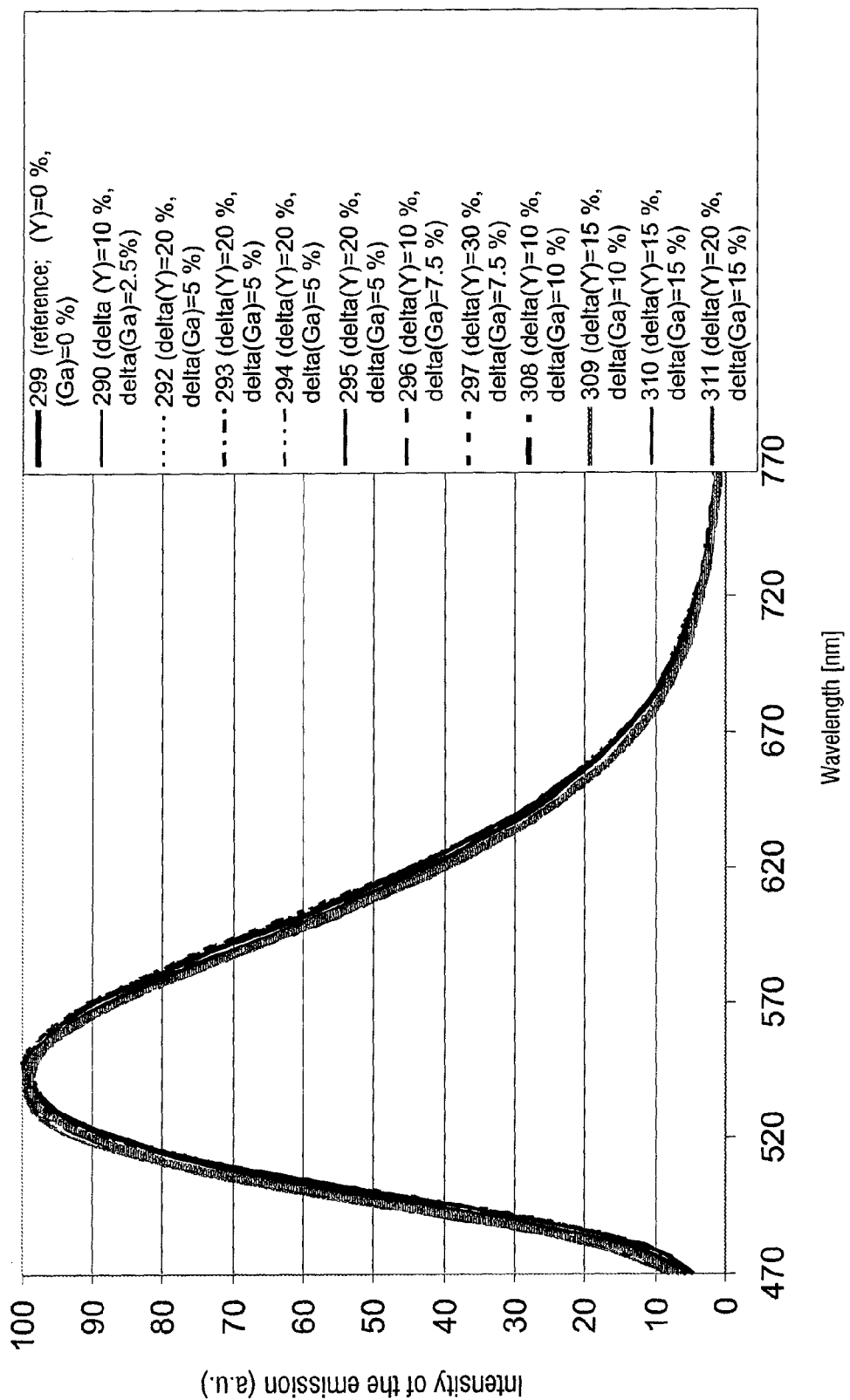
FIG. 17 shows a comparison of the emission in the case of Lu garnets containing different proportions of Y.

FIG. 17 shows emission spectra for various garnets in which the percentage of Y has been varied. It is apparent that the emission remains virtually constant for small Y fractions.

Tab. 4 shows pure LuAGAG luminescent substances with incremental increases in Ga percentage. These table values, as of the other tables also, basically relate always to a reference excitation at 460 nm.

TABLE 8

$A_3B_5O_{12}$: Ce Lu(Al, Ga) garnets (called LuAGAG)

| Sample number | Fraction Lu, remainder Y | Fraction Ga, remainder Al | x | y | Lambda_dom/ nm | FWHM/ nm | rel. QE |
|---|---|---|---|---|---|---|---|
| SL 315c/08 | 100% | 5.0% | 0.350 | 0.567 | 557.5 | 109.1 | 1.00 |
| SL 005c/09 | 100% | 15.0% | 0.337 | 0.572 | 555.1 | 104.3 | 1.01 |
| SL 003c/09 | 100% | 20.0% | 0.351 | 0.564 | 557.7 | 108.4 | 1.05 |
| SL 167c/08 | 100% | 25.0% | 0.352 | 0.562 | 557.9 | 109.8 | 1.05 |

TABLE 7

$A_3B_5O_{12}$: Ce (Lu, Y) garnets

| Sample number | Fraction Lu, remainder Y | Fraction Ga, remainder Al | x | y | Lambda_dom/ nm | FWHM/ nm | rel. QE |
|---|---|---|---|---|---|---|---|
| SL 299c/08 | 100% | 0.0% | 0.393 | 0.557 | 564.2 | 112.5 | 1.00 |
| SL 290c/08 | 88% | 2.5% | 0.396 | 0.556 | 564.6 | 113.2 | 1.02 |

TABLE 7-continued $A_3B_5O_{12}$: Ce (Lu, Y) garnets

| Sample number | Fraction Lu, remainder Y | Fraction Ga, remainder Al | x | y | Lambda_dom/ nm | FWHM/ nm | rel. QE |
|---|---|---|---|---|---|---|---|
| SL291c/08 | 68% | 2.5% | 0.414 | 0.550 | 567.1 | 115.4 | 1.01 |
| SL 292c/08 | 78% | 5.0% | 0.400 | 0.555 | 565.2 | 113.7 | 1.01 |
| SL 293c/08 | 78% | 5.0% | 0.400 | 0.556 | 565.1 | 114.3 | 1.01 |
| SL 294c/08 | 78% | 5.0% | 0.401 | 0.555 | 565.3 | 114.8 | 1.02 |
| SL 295c/08 | 78% | 5.0% | 0.401 | 0.555 | 565.3 | 113.8 | 1.02 |
| SL 296c/08 | 88% | 7.5% | 0.388 | 0.559 | 563.5 | 112.8 | 1.02 |
| SL 297c/08 | 68% | 7.5% | 0.402 | 0.555 | 565.4 | 114.4 | 1.03 |
| SL 308c/08 | 88% | 10.0% | 0.383 | 0.560 | 562.8 | 112.1 | 1.03 |
| SL 309c/08 | 83% | 10.0% | 0.387 | 0.559 | 563.3 | 112.5 | 1.03 |
| SL310c/08 | 83% | 15.0% | 0.381 | 0.560 | 562.5 | 113.0 | 1.03 |
| SL311c/08 | 78% | 15.0% | 0.385 | 0.559 | 563.1 | 112.3 | 1.02 |

TABLE 4

The Eu concentration is 0.5% referred to M (in this Ca or Ca and Cu)

| Sample | Molecular formula | Additive element (x) | Mol (add. elem.) | rel. QE | x | y | λ dom | FWHM |
|---|---|---|---|---|---|---|---|---|
| 176 | $CaALSiN_3$: Eu + 2 (0.5%) | no | — | 100.0% | 0.664 | 0.332 | 610.7 | 87.3 |
| 180 | $CaAL_{1-x}Si_{1+x}N_{3-x}O_x$: Eu + 2 (0.5%) | O | 0.020 | 103.9% | 0.660 | 0.335 | 609.7 | 88.2 |
| 181 | $CaAL_{1-x}Si_{1+x}N_{3-x}O_x$: Eu + 2 (0.5%) | O | 0.060 | 103.3% | 0.658 | 0.338 | 608.8 | 88.4 |
| 182 | $CaAL_{1-x}Si_{1+x}N_{3-x}O_x$: Eu + 2 (0.5%) | O | 0.200 | 93.73% | 0.634 | 0.358 | 603.2 | 90.2 |
| 183 | $CaAL_{1-x}Si_{1+x}N_{3-x}O_x$: Eu + 2 (0.5%) | O | 0.600 | 77.7% | 0.583 | 0.406 | 592.8 | 104.4 |
| 187 | $CaAL_{1+2x}Si_{1-2x}N_{3-x}Cl_x$: Eu + 2 (0.5%) | Cl | 0.005 | 100.4% | 0.664 | 0.332 | 610.7 | 87.3 |
| 188 | $CaAL_{1+2x}Si_{1-2x}N_{3-x}Cl_x$: Eu + 2 (0.5%) | Cl | 0.020 | 100.5% | 0.666 | 0.330 | 611.3 | 86.7 |
| 189 | $CaAL_{1+2x}Si_{1-2x}N_{3-x}Cl_x$: Eu + 2 (0.5%) | Cl | 0.030 | 101.4% | 0.664 | 0.331 | 611.0 | 87.6 |
| 190 | $CaAL_{1+2x}Si_{1-2x}N_{3-x}Cl_x$: Eu + 2 (0.5%) | Cl | 0.050 | 101.2% | 0.659 | 0.336 | 609.4 | 88.5 |
| 191 | $CaAL_{1+2x}Si_{1-2x}N_{3-x}F_x$: Eu + 2 (0.5%) | F | 0.005 | 103.8% | 0.670 | 0.327 | 612.4 | 87.0 |
| 192 | $CaAL_{1+2x}Si_{1-2x}N_{3-x}F_x$: Eu + 2 (0.5%) | F | 0.010 | 101.4% | 0.670 | 0.326 | 612.7 | 86.9 |
| 193 | $CaAL_{1+2x}Si_{1-2x}N_{3-x}F_x$: Eu + 2 (0.5%) | F | 0.020 | 101.9% | 0.668 | 0.327 | 612.4 | 87.2 |
| 194 | $CaAL_{1+2x}Si_{1-2x}N_{3-x}F_x$: Eu + 2 (0.5%) | F | 0.050 | 99.5% | 0.662 | 0.333 | 610.3 | 87.0 |
| 235 | $(Ca_{1-x}Cu_xAL_{1+4x}Si_{1-4x}N_{3-2x}F_{2x}$: Eu(0.5%) | Cu, F | 0.005 | 93.3% | 0.665 | 0.332 | 610.7 | 86.4 |
| 236 | $(Ca_{1-x}Cu_xAL_{1+4x}Si_{1-4x}N_{3-2x}F_{2x}$: Eu(0.5%) | Cu, F | 0.012 | 93.5% | 0.661 | 0.335 | 609.7 | 87.4 |
| 237 | $(Ca_{1-x}Cu_xAL_{1+4x}Si_{1-4x}N_{3-2x}F_{2x}$: Eu(0.5%) | Cu, F | 0.050 | 86.9% | 0.640 | 0.354 | 604.2 | 91.5 |

The invention claimed is:

1. A conversion LED comprising a chip which emits primary radiation and a luminescent substance-containing layer which is on the chip or positioned so that it intercepts the primary radiation emitted from the chip and which converts at least some of the primary radiation of the chip into secondary radiation, wherein a first luminescent substance of the $A_3B_5O_{12}$:Ce garnet type which emits yellow green and a second luminescent substance of the $MAlSiN_3$:Eu calsine type which emits orange red is used, wherein the peak wavelength of the primary radiation lies in the 435 to 455 nm range, the first luminescent substance being a garnet having essentially the cation A=75 to 100 mol. % Lu, remainder Y and a Ce content of 1.5 to 2.9 mol. %, where B=10 to 40 mol. % Ga, remainder Al, while the second luminescent substance is of the basic $MAlSiN_3$:Eu type, where M is Ca alone or at least 80% Ca and the remainder of M is Sr, Ba, Mg, Li or Cu, in each case alone or in combination, wherein some and at most 5% of the Al is replaced by B, and wherein a part of N is optionally replaced by O, F, Cl, alone or in combination.

2. The conversion LED as claimed in claim 1, wherein the second luminescent substance contains Ca alone as component M.

3. The conversion LED as claimed in claim 1, wherein the second luminescent substance contains 0.2 to 1.3 mol.-% Eu as doping which is attributed to the component M.

4. The conversion LED as claimed in claim 1, wherein the first luminescent substance is $A_3B_5O_{12}$, where A=80 to 100% Lu, remainder Y and a Ce content of 1.5 to 2.5%, where B=15 to 25% Ga, remainder Al.

5. The conversion LED as claimed in claim 1, wherein said M contains at least 95% Ca.

6. The conversion LED as claimed in claim 1, wherein in the case of the component B the first luminescent substance contains 20 to 30 mol.-% Ga, the remainder being Al.

7. The conversion LED as claimed in claim 1, wherein the first luminescent substance contains 1.8% to 2.6 mol.-% Ce as doping which is attributed to the component A, the remainder being A.

8. The conversion LED as claimed in claim 1, wherein the second luminescent substance contains 0.3 to 0.9 mol.-% Eu as doping which is attributed to the component M.

9. The conversion LED as claimed in claim 1, which emits a mixed radiation of the primary radiation and the secondary radiation, said mixed radiation having a CRI between 96 to 98 with, at the same time, good red rendering with R9=90 to 99.

10. The conversion LED as claimed in claim 1, wherein in the second luminescent substance N is partially replaced by O, F, Cl, alone or in combination.

* * * * *